United States Patent
Hack et al.

(10) Patent No.: US 12,336,409 B2
(45) Date of Patent: *Jun. 17, 2025

(54) ORGANIC ELECTROLUMINESCENT DEVICES

(71) Applicant: Universal Display Corporation, Ewing, NJ (US)

(72) Inventors: Michael Hack, Carmel, CA (US); Michael Stuart Weaver, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/529,090

(22) Filed: Dec. 5, 2023

(65) Prior Publication Data

US 2024/0114741 A1 Apr. 4, 2024

Related U.S. Application Data

(63) Continuation of application No. 17/410,510, filed on Aug. 24, 2021, now Pat. No. 11,877,489.
(Continued)

(51) Int. Cl.
*G02F 1/23* (2006.01)
*H10K 50/115* (2023.01)
(Continued)

(52) U.S. Cl.
CPC ............ *H10K 59/353* (2023.02); *G02F 1/23* (2013.01); *H10K 50/115* (2023.02);
(Continued)

(58) Field of Classification Search
CPC ............ H10K 59/353; H10K 50/115; H10K 50/852; H10K 59/131; H10K 59/351;
(Continued)

(56) References Cited

U.S. PATENT DOCUMENTS 4,769,292 A 9/1988 Tang
5,247,190 A 9/1993 Friend
(Continued)

FOREIGN PATENT DOCUMENTS

| KR | 20200063964 A | 6/2020 |
| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.
(Continued)

*Primary Examiner* — Donald L Raleigh
(74) *Attorney, Agent, or Firm* — Butzel Long

(57) ABSTRACT

Devices, arrangements, and techniques are provided to improve the color saturation of displays such as OLED displays while avoiding or substantially reducing any increase in power consumption that typically would be associated with such increase in saturation. A three-subpixel per pixel red/green/blue (RGB) architecture is provided as well as a four sub-pixel approach which uses two red sub-pixels for each pixel (red/red/green/blue, or R1R2GB).

20 Claims, 5 Drawing Sheets

| D65 | | Power (mW) | % Rec2020 | Saturation Parameter |
|---|---|---|---|---|
| | sRGB | 1706 | 34.4 | 0.89 |
| | DCIP3 | 1840 | 63.9 | 1.39 |
| | Rec2020 | 2145 | 100 | 1.21 |
| | DCIP3 red - mid DCIP3/Rec2020 green (31) | 1816 | 81 | 2.24 |
| | mid DCIP3/Rec2020 red - Rec2020 green (33) | 1957 | 96.8 | 2.01 |
| | DCIP3 red and Rec2020 green (32) | 1843 | 93.3 | 3.14 |

Related U.S. Application Data

(60) Provisional application No. 63/085,015, filed on Sep. 29, 2020.

(51) Int. Cl.
*H10K 50/852* (2023.01)
*H10K 59/131* (2023.01)
*H10K 59/35* (2023.01)
*H10K 59/38* (2023.01)

(52) U.S. Cl.
CPC ......... *H10K 50/852* (2023.02); *H10K 59/131* (2023.02); *H10K 59/351* (2023.02); *H10K 59/38* (2023.02)

(58) Field of Classification Search
CPC ............... H10K 59/38; H10K 59/876; H10K 2101/20; H10K 2101/25; H10K 2101/60; H10K 59/35; G02F 1/23; H01L 25/167
See application file for complete search history.

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 9,347,647 B2 | 5/2016 | Hamer | |
| 9,385,168 B2 | 7/2016 | Hack | |
| 9,424,772 B2 | 8/2016 | Hack | |
| 9,590,017 B2 | 3/2017 | Hack | |
| 10,229,956 B2 | 3/2019 | Hack | |
| 10,243,023 B2 | 3/2019 | Hack | |
| 10,304,906 B2 | 5/2019 | Hack | |
| 10,374,017 B2 | 8/2019 | Hack | |
| 10,580,832 B2 | 3/2020 | Hack | |
| 10,700,134 B2 | 6/2020 | Hack | |
| 11,049,907 B2 | 6/2021 | Hack | |
| 2003/0230980 A1 | 12/2003 | Forrest | |
| 2004/0174116 A1 | 9/2004 | Lu | |
| 2009/0115952 A1 | 5/2009 | Nakamura | |
| 2012/0018712 A1 | 1/2012 | Hamaguchi | |
| 2015/0295198 A1 | 10/2015 | Xu | |
| 2015/0340410 A1 | 11/2015 | Hack | |
| 2015/0349034 A1 | 12/2015 | Hack | |
| 2016/0071468 A1 | 3/2016 | Park | |
| 2017/0229663 A1 | 8/2017 | Tsai | |
| 2018/0269260 A1* | 9/2018 | Ghosh | H10K 59/50 |
| 2018/0341055 A1 | 11/2018 | Yuan | |
| 2019/0280055 A1 | 9/2019 | Hack | |
| 2020/0111849 A1 | 4/2020 | He | |
| 2020/0152915 A1 | 5/2020 | Mori | |
| 2020/0212118 A1 | 7/2020 | Hack | |
| 2020/0312922 A1 | 10/2020 | Hack | |
| 2020/0365669 A1 | 11/2020 | Kim | |
| 2020/0388651 A1 | 12/2020 | Woo | |
| 2021/0167139 A1 | 6/2021 | Hack | |
| 2021/0332292 A1* | 10/2021 | Hu | C09K 11/665 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Yang, Hsueh-Yen, "The Method of RGBX Sub-pixel Architecture for Power Efficient Display", 2017, 2017 IEEE International Conference on Consumer Electronics—Taiwan, pp. 1 and 2 (Year: 2017).

* cited by examiner

| D65 | | Power (mW) | % Rec2020 | Saturation Parameter |
|---|---|---|---|---|
| | sRGB | 1706 | 34.4 | 0.89 |
| | DCIP3 | 1840 | 63.9 | 1.39 |
| | Rec2020 | 2145 | 100 | 1.21 |
| | DCIP3 red - mid DCIP3/Rec2020 green (31) | 1816 | 81 | 2.24 |
| | mid DCIP3/Rec2020 red - Rec2020 green (33) | 1957 | 96.8 | 2.01 |
| | DCIP3 red and Rec2020 green (32) | 1843 | 93.3 | 3.14 |

ORGANIC ELECTROLUMINESCENT DEVICES

CROSS-REFERENCE TO RELATED APPLICATIONS

This application is a continuation of U.S. Nonprovisional patent application Ser. No. 17/410,510, filed Aug. 24, 2021, which is a non-provisional of and claims the priority benefit of U.S. Provisional Patent Application Serial No. 63/085,015, filed Sep. 29, 2020, the entire contents of each are incorporated herein by reference.

FIELD

The present invention relates to devices and techniques for fabricating organic emissive devices, such as organic light emitting diodes, having high color gamut, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

In an embodiment, a device is provided that includes a full-color display panel having a plurality of pixels, each comprising one or more sub-pixels, at least one of which includes a green sub-pixel, a blue sub-pixel, and two red sub-pixels having different emission spectra.

In an embodiment, a device is provided that includes a full-color organic display panel comprising a plurality of pixels, at least one of which includes a red sub-pixel having 1931 CIE coordinates (Rx, Ry); and a green sub-pixel having 1931 CIE coordinates (Gx, Gy); wherein the product $(0.75-Rx)(Ry-0.25)(Gy-0.5)(0.4-Gx)(10^4)$ is at least than 1.5.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in in U.S. Pat. No. 7,279,704 at cols. 5-6, which are incorporated by reference.

Figure 1:
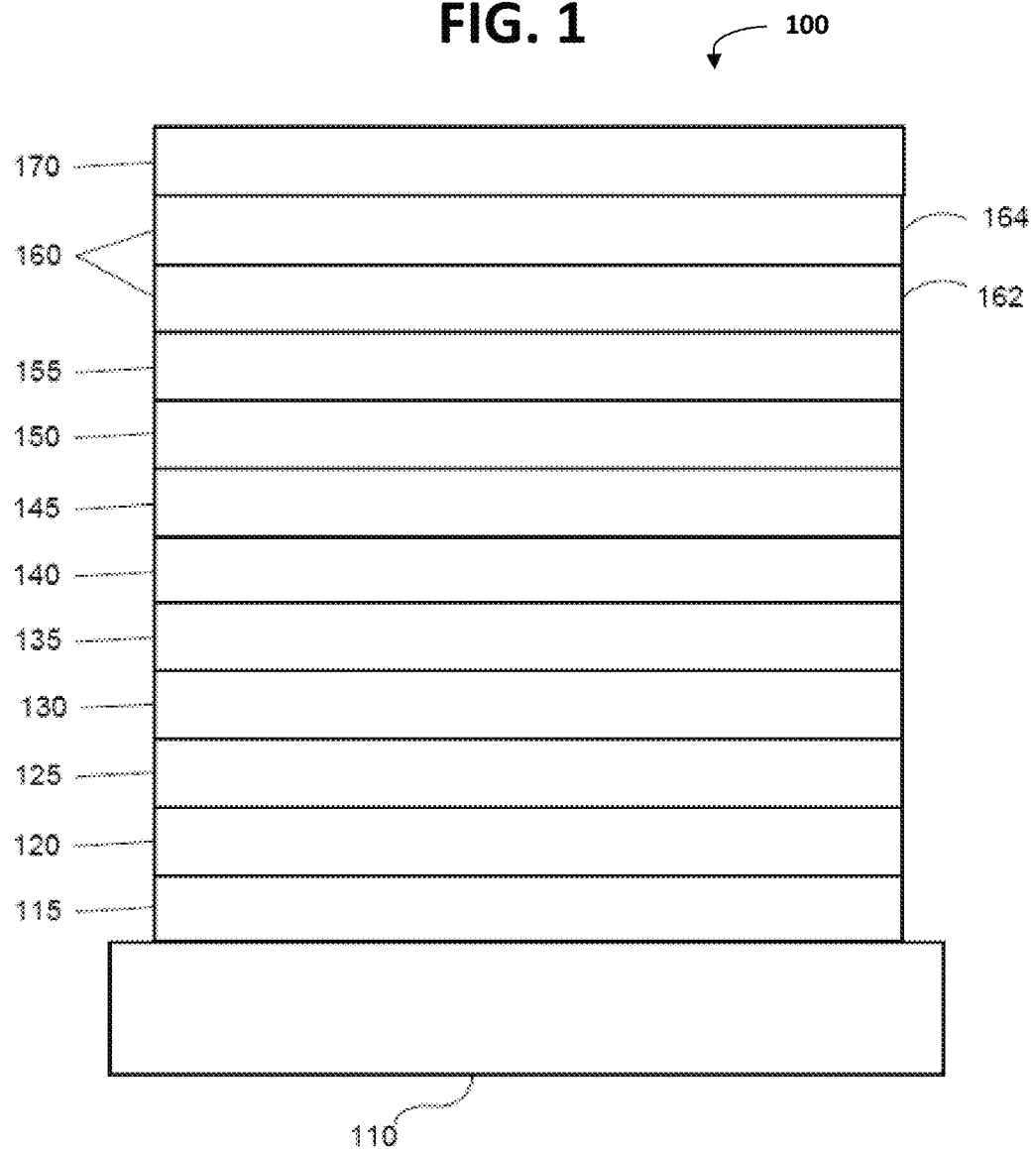
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
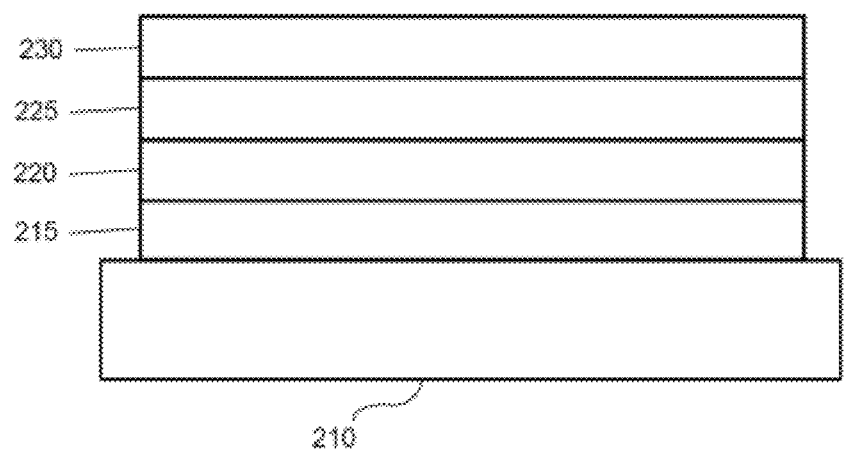
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Recent trends in display technology have seen large improvements in the performance of the image quality of OLED displays, particularly those used in mobile and portable devices such as phones and laptops. Resolution has increased dramatically as has size and color gamut—moving from standard RGB (sRGB) color space to the Digital Cinema Initiatives P3 color space (DCI-P3, DCI/P3, or DCIP3) color systems, with further advances to the ITU-R Recommendation BT.2020 (Rec2020) color space being planned for 3 to 5 years from now. Most current mobile and TV displays have moved from sRGB to the DCIP3 color system. The BT2020 system has a 56% improvement in its ability to render colors compared to DCIP3 (and 190% improvement over sRGB) when plotted on 1931 CIE coordinates.

However, increased display size, resolution and color gamut all typically result in higher power consumption for the display device. While great improvements in OLED materials, devices and display driving have improved display efficiencies, the industry is looking to further improve display visual appearance while minimizing any associated increase in power consumption. Tables 1-3 below show the impact of blue, green, and red color saturation on power consumption of a device, for a simulated 10.4" OLED display operating at 500 cd/m².

TABLE 1

Different green and red color combinations with both DCIP3 and Rec2020 blues

| RG Emitter Combination | Total Power (mW) | |
|---|---|---|
| | DCIP3 Blue | Rec2020 Blue |
| DCIP3 green and red | 1840 | 1776 |
| Mid DCIP3/Rec2020 green and red | 1953 | 1903 |
| Rec2020 green and red | 2199 | 2145 |

TABLE 2

Increasing green saturation with DCIP3 red

| Green Emitter | Total Power (mW) | |
|---|---|---|
| | DCIP3 Blue | Rec2020 Blue |
| DCIP3 green | 1840 | 1776 |
| Mid DCIP3/Rec2020 green | 1863 | 1816 |
| Rec2020 green | 1892 | 1843 |

TABLE 3

Increasing red saturation with DCIP3 green

| Red Emitter | Total Power (mW) | |
|---|---|---|
| | DCIP3 Blue | Rec2020 Blue |
| DCIP3 red | 1840 | 1776 |
| Mid DCIP3/Rec2020 red | 1901 | 1846 |
| Rec2020 red | 2024 | 1962 |

As shown in Table 1, increasing the blue color saturation (from DCIP3 to Rec2020) results in approximately a 3% decrease in power consumption. This is observed regardless of which combination of green and red emitters is used (DCIP3 and/or Rec2020), as shown by comparing the DCIP3 and Rec2020 blue columns in each row. Table 2 indicates that increasing green saturation from DCIP3 to Rec2020 results in a small increase in power consumption, about 3%. Notably, as indicated in Table 3, increasing the red saturation from DCIP3 to Rec2020 leads to a much larger increase in power consumption of about 10%. For example, using a Rec2020 red emitter with DCIP3 green and blue emitters results in a total power consumption of 2024 mW, compared to a power consumption of 1840 mW when the lower-saturation DCIP3 red is used with the same DCIP3 green and blue.

Embodiments disclosed herein provide novel devices, arrangements, and techniques that may improve the color saturation of OLED displays while avoiding or substantially reducing any increase in power consumption that typically would be associated with such increase in saturation, both with a three-subpixel per pixel red/green/blue (RGB) architecture and a novel four sub-pixel approach which uses two red sub-pixels for each pixel (red/red/green/blue, or R1R2GB). Using a conventional three-subpixel architecture, a partial Rec2020 gamut may be achieved without a significant increase in power. This may be accomplished, for example, by using a design rule that is based on improving the color gamut of the display by increasing green saturation more than red, thereby having little impact on power consumption. Using a four-subpixel R1R2GB architecture as disclosed herein, a Rec2020 gamut may be achieved with very little power increase from current DCIP3 color gamut displays.

That is, embodiments disclosed herein provide techniques to increase display color gamut while minimizing or avoiding any associated increase in power consumption by using a conventional side-by-side three sub-pixel RGB with a design rule that increases green saturation more than red; and/or by using a novel four sub-pixel R1R2GB architecture.

As described in further detail below, it has been found that, for an OLED display, increasing the blue saturation from DCIP3 to Rec2020 slightly decreases display power consumption, increasing the green saturation from DCIP3 to Rec2020 slightly increases display power consumption, while increasing the red saturation from DCIP3 to Rec2020 more significantly increases display power consumption.

Tables 4A-4C below (collectively "Table 4") show the results of a series of simulations of different RGB emitters, showing their 1931 CIE, cd/A, proportion to make D65 white point, display power consumption, percentage of Rec2020 color gamut achieved by the specific combination of RGB emitters, and a new parameter, referred to herein as the "saturation parameter" (sat parameter) for a series of 10.4" OLED displays operating at 500 cd/m² and 50% pixels fully illuminated with a 44% efficient circular polarizer.

Run 1 in Table 4 represents a standard RGB (sRGB) color system. Run 2 represents a DCIP3 system, and run 5 represents a Rec2020 system.

The saturation parameter for a device is calculated by the following product:

$$(0.75-R_x)*(R_y-0.25)*(G_y-0.5)*(0.4-G_x)$$

where the 1931 CIE coordinates of the green emitter are given by $(G_x, G_y)$ and for the red emitter by $(R_x, R_y)$, and which may be multiplied by a scaling factor such as $10^4$ for convenience. Table 4 shows the power consumption, color gamut (as a percentage of the Rec2020 gamut, "% Rec2020"), and the above-defined scaled saturation parameter for the various RGB emitter combinations. The cases where the saturation parameter exceeds 1.5 are highlighted in Table 4 and represent color combinations where the color saturation has been increased with only a minimal increase in power consumption, by increasing the green saturation more than or relative to the red saturation.

As disclosed herein, it has been found that an OLED or similar display may increase the provided color gamut while minimizing the increase in display power consumption by selecting sub-pixels such that the saturation parameter as defined above is at least 1.5 when scaled, i.e., $$(0.75-Rx)*(Ry-0.25)*(Gy-0.5)*(0.4-Gx)*10,000 > 1.5$$

This is the case because a saturation parameter of 1.5 or higher represents a color gamut system in which the green is relatively more saturated than the red. As shown by the data in Tables 1-4, such an arrangement may provide an improved color gamut without the associated increase in power consumption that would be expected for conventional color gamut arrangements.

It has been found that devices that meet this requirement can provide improved color gamut without the associated rise in power consumption that would conventionally be required to achieve the improved color gamut. Table 4 also show similar simulations and combinations of red and green emitters for both DCIP3 and Rec2020 blue emitters. These results indicate that the DCIP3 blue leads to approximately a 3% higher power consumption than the use of a Rec2020 blue, for the same combination of red and green emitters.

Figures 3, 4:
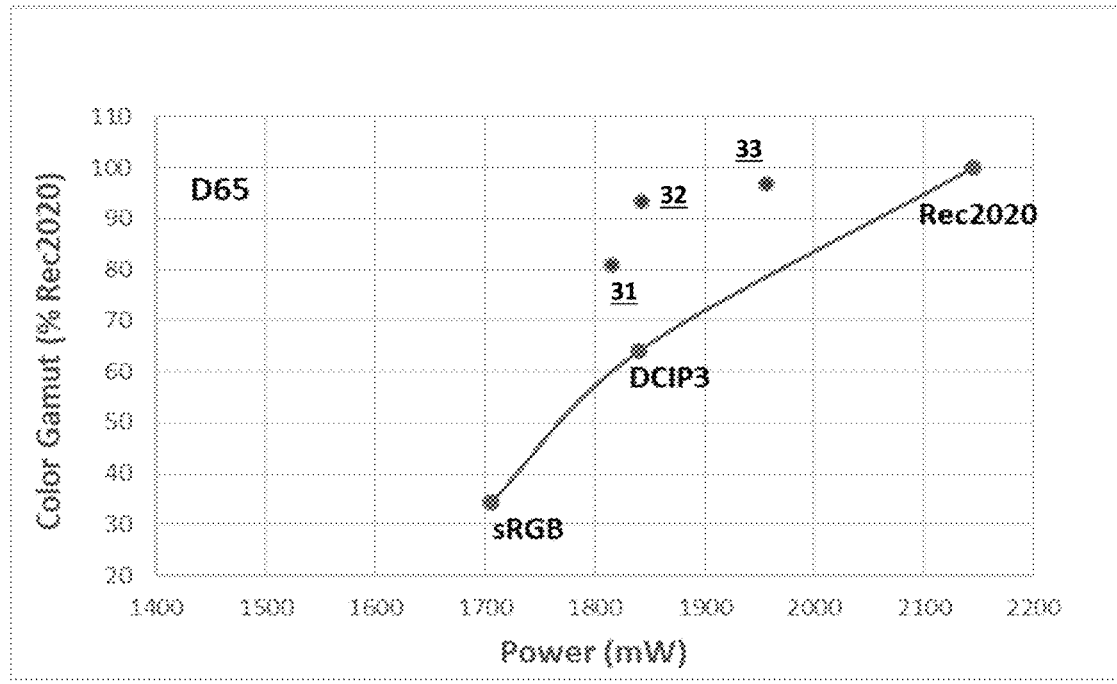
FIGS. 3 and 4 show a plot and simulated results, respectively, for a 10.4" OLED display operating at 500 cd/m$^2$ with color gamut as a percentage of Rec2020 versus power consumption for a D65 white point and three common color systems. Also shown are three additional data points with enhanced green color saturation.

The results of the simulation results shown in Table 4 are summarized in FIG. 3, which shows color saturation versus power consumption for 3 color systems: sRGB, DCIP3 and Rec2020. Increasing color saturation requires higher display power consumption. FIG. 4 shows the raw data plotted in FIG. 3. Three additional results are shown which refer to data points where the saturation of the green emitter exceeds that of the red, based on the DCIP3 and Rec2020 color gamuts—so a DCIP3 red and a green in between DCIP3 and Rec2020, a red in between DCIP3 and Rec2020 and a Rec2020 green and a DCIP3 red and a Rec2020 green. These correspond to runs 7, 13, and 17 in Table 4 and FIG. 3 as noted (32, 31, and 33, respectively). In all three cases, the color saturation is greatly increased without a significant increase in power consumption relative to the cases for the three established color systems. All three of the example devices provide enhanced green saturation relative to red saturation than for the established color gamuts.

Accordingly, it has been found that using red and green sub-pixels in a device, where the saturation parameter of the device is at least 1.5, improves the color gamut of the device while minimizing or avoiding the increase in power consumption that typically would be expected with a corresponding color gamut using conventional arrangements. In some embodiments, a higher saturation parameter threshold may be used, such as 1.6, 1.7, 1.8, 1.9, 2.0, 2.1, 2.2, 2.3, 2.4, 2.5, 3, 3.5, or more. In general, at higher saturation parameter values, the green is relatively more saturated than the red compared to conventional color gamut systems. The saturation parameter typically is less than 1.5 in conventional color gamut displays.

In a side-by-side or equivalent sub-pixel arrangement, each red, green, or blue sub-pixel provides a corresponding RGB color emission. Each sub-pixel may include one or more individual devices to produce the associated color, such as the OLED devices described with respect to FIGS. 1 and 2, microLED devices, quantum dot devices, or combinations thereof. For example, one or more of the sub-pixels in a full-color pixel within the display device may include an OLED, a microLED, or a quantum dot device, any of which may be unfiltered or filtered, or otherwise include one or more color-altering components such as down-conversion layers, quantum dots, color filters, micro-cavity structures, and the like. Any suitable emissive material or materials may be used in each device.

In some embodiments it may be preferred for the RGB color emitted by a full-color pixel as disclosed herein to be at least as saturated as the corresponding DCIP3 color gamut. Using the DCIP3 gamut as a threshold may ensure that a minimum acceptable gamut for some applications is obtained, while still requiring less power or a smaller increase in required power compared to conventional techniques available to achieve a similar color gamut. For example, comparing DCIP3 color gamut Run 2 with Run 7 in which the green saturation is increased to Rec2020, only a 3 mW increase in power consumption is observed for Run 7, but the color gamut increases from 64% to 93% of the Rec2020 color gamut.

As previously disclosed and as shown in the results provided in Table 4, embodiments disclosed herein may provide a substantial portion of a desired color gamut such as the Rec2020 color gamut, while still requiring less power to operate than conventional devices. This may be achieved, for example, by selecting individual sub-pixel structures to provide a saturation parameter of at least 1.5 or higher as previously disclosed. Specifically, embodiments disclosed herein may operate with, i.e., provide a usable color gamut equivalent to 95% of the Rec2020 1931 CIE color gamut while operating at a power consumption of not more than 6.85 mW/cm$^2$ (e.g., 2145 mW for a 313 cm$^2$ panel) at a luminance of 500 nits; or 90% of the Rec2020 gamut at a power consumption of not more than 5.78 mW/cm$^2$ (e.g., 1840 mW, 313 cm$^2$ panel) at 500 nits; or, more generally and synthesizing the results of Table 4, at least 80% or 90% of the Rec2020 1931 CIE color gamut, while operating with a power consumption of not more than 5-6 mW/cm$^2$.

Figure 5A:
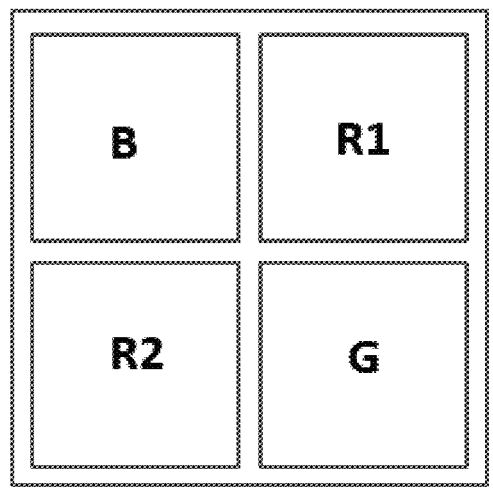
FIGS. 5A, 5B, and 5C show examples of sub-pixel layouts for a four sub-pixel architecture as disclosed herein, for example using a DCIP3 red and a Rec2020 Red combined with Rec2020 blue and green to achieve Rec2020 image quality with close to DCIP3 power consumption.
Figure 5B:
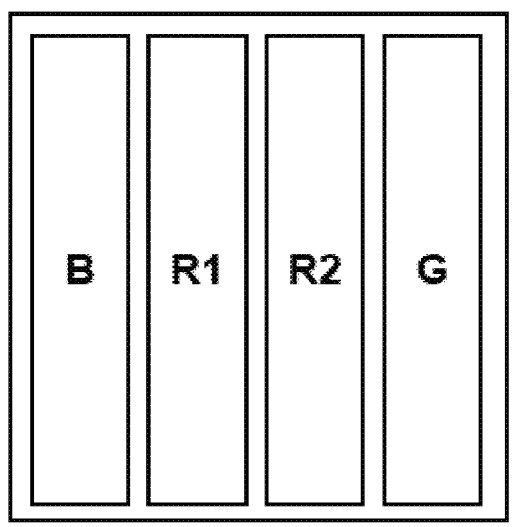
Figure 5C:
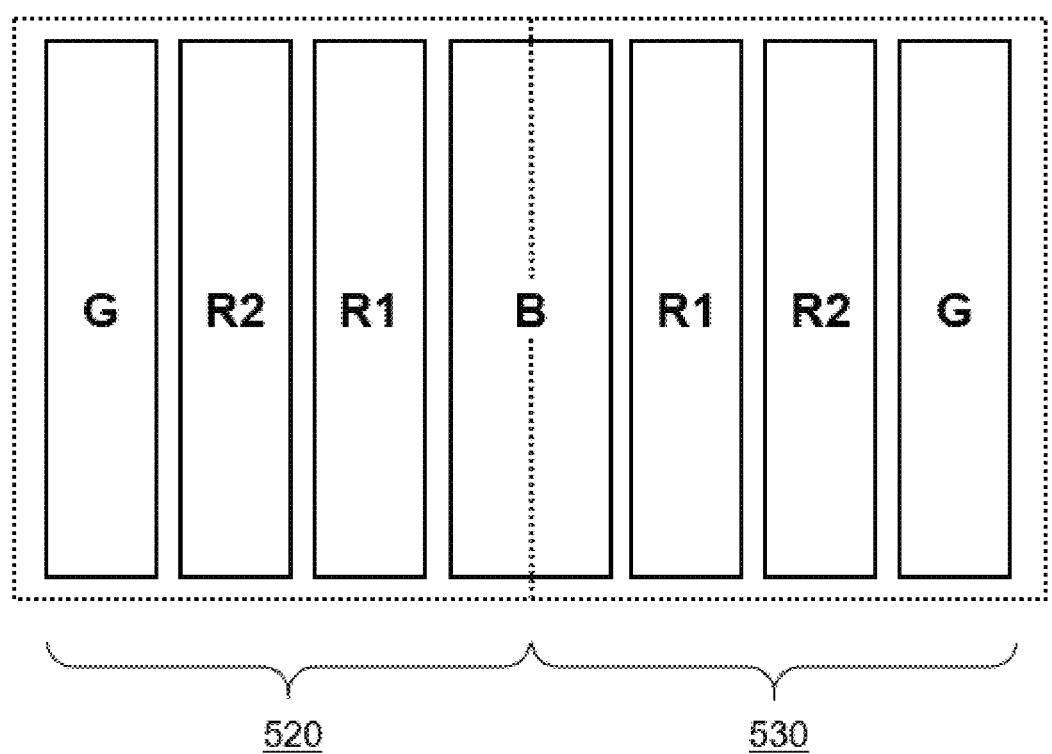

From the prior disclosure and the experimental results shown in Table 4, it can be seen that OLED display power consumption increases with increasing color saturation as a result of increasing the red subpixel color saturation, whereas increasing both the blue and green color saturation generally does not increase power consumption. To take advantage of this understanding, some embodiments may use a novel four subpixel display that includes a deep blue subpixel (B), a saturated green subpixel (G), a saturated red subpixel (R2) and a less saturated red pixel (R1), which may be referred to as a R1R2GB architecture. Examples of layouts that use four sub-pixels are shown in FIGS. 5A-5C, though other arrangements may be used. Generally, each arrangement will include sub-pixels arranged such that each pixel includes one of each type, though in some embodiments a specific sub-pixel structure may provide a sub-pixel for multiple pixels, i.e., the sub-pixel may be "shared" among multiple pixels.

FIG. 5A shows a sub-pixel arrangement in which the four sub-pixels are arranged in a 2×2 grid as shown, with the red sub-pixels in opposite quadrants. FIG. 5B shows a linear arrangement of four sub-pixels. FIG. 5C shows an arrangement in which the central blue sub-pixel is shared between two adjacent pixels 520, 530. Any of the pixel arrangements shown in FIGS. 5A-5C may be repeated across a display panel, or portions of each arrangement may be repeated such as where sub-pixel rendering techniques are used, sub-pixels are shared between pixels, or the like. Generally the R1 and R2 sub-pixels will have different emission spectra, such that the R2 sub-pixel is more saturated than the R1 sub-pixel. The specific arrangement of sub-pixels shown in FIGS. 5A-5C is illustrative and other arrangements may be used. In some cases, it may be desirable to minimize apparent dark areas arising due to luminance content areas in each pixel by arranging sub-pixels so that, for example, the R1 and R2 sub-pixels are adjacent to one another. For example, the B and/or R2 sub-pixels may have the least overall luminance content, especially since the more saturated R2 sub-pixel typically will have a much lower "on time" than the R1 sub-pixel.

Notably, arrangements disclosed herein may use only the four sub-pixels in each pixel to achieve a high color gamut, whereas other types of devices may use multiple sub-pixels of each type. For example, other display architectures may use two of each sub-pixel (two green, two blue, and two red) in order to achieve a higher color gamut. Such arrangements may be less desirable than the R1R2GB arrangements disclosed herein since they require more complex circuitry and, in many cases, a higher total operating power, especially in configurations which use multiple sub-pixels of the same color to render a given color without consideration for the specific color being rendered, the amount of power used by each sub-pixel, and the like.

In contrast, embodiments disclosed herein recognize and account for the fact that most images can be rendered using non-saturated colors. Specifically, when using a R1R2GB sub-pixel arrangement as disclosed herein, most images can be rendered using only the green, blue, and R1 (less saturated) sub-pixels, thereby resulting in a moderate power consumption with acceptable display quality and color gamut. When highly saturated reds are required or desired, the more saturated R2 pixel may be used. Such an arrangement may be similar in approach, and may use similar driving techniques, to RGB1B2 arrangements. Examples of RGB1B2 devices are provided in U.S. Pat. Nos. 8,827,488, 8,902,245, 9,385,168, 10,304,906, and 10,700,134, the disclosure of each of which is incorporated by reference.

Because the more saturated R2 subpixel may be used for only a relatively small percentage of the time, the display may be able to render a deeper red color but with the power consumption of a lighter red on average, without using the specific combinations of sub-pixel types previously described with respect to Table 4. So, for example, if a Rec2020 emitter system (GBR2) is used in conjunction with an additional DCIP3 red subpixel (R1), the resulting display may achieve 100% of the Rec2020 color gamut with a power consumption very close to a DCIP3 display. Using the base Rec2020 and DCIP3 values from Table 4, for example, the resulting device may use about 1840 mW as opposed to 2145 mW for a Rec2020 color gamut display, a power savings of nearly 15%. This approach can be used for any desired color combinations. In some embodiments, the more-saturated red sub-pixel also may be relatively efficient, such that it causes a relatively small increase in power relative to the less-saturated sub-pixel. For example, the saturated R1 red sub-pixel may use not more than 10% more power than the less-saturated R2 sub-pixel when used to generate the same color in a pixel. That is, when a full-color display using a four sub-pixel arrangement as disclosed herein is used to display a given image, a pixel using the green, blue, and more-saturated red sub-pixel may use not more than 10% or 5% more power than when the same pixel uses the green, blue, and less-saturated red sub-pixel to display the same image. This may hold true even where the sub-pixels have relatively disparate CIE coordinates, such as where the 1931 CIE x coordinates of the red sub-pixels differ by at least 0.02, 0.04, or 0.06. Furthermore, sub-pixel types may be selected based upon the data in Table 4 as previously disclosed, but using a four sub-pixel arrangement such as those shown in FIGS. 5A-5C, leading to additional improvements in color gamut and/or power usage.

The "proximity" of the red sub-pixels on a color gamut chart may vary depending upon the desired saturation and/or power consumption. In some embodiments, the 1931 CIE x coordinate of the two sub-pixels may vary by 0.02, 0.04, 0.06 or more. The more saturated R2 sub-pixel may have an x coordinate of at least 0.69 or 0.70.

In some embodiments it may be desirable to strictly limit use of the more saturated sub-pixel, and/or to limit the use of the two red sub-pixels concurrently. For example, via circuitry, programming logic, firmware, or combinations thereof, a four sub-pixel device may be configured to only use one or the other of the two red sub-pixels, such that both red sub-pixels are prevented from being energized (i.e., operated to generate light) concurrently some or all of the time. That is, the device may be configured such that it never energizes both red sub-pixels at the same time, or so that concurrent use of the two red sub-pixels is limited to only specific situations such as where the display is required to operate at very high luminances, such as for readability in bright sunlight. This and other configurations allow for devices that require no more than three data lines per pixel. For example, a single data line may be used in conjunction with other driving circuitry, programming logic, and/or firmware to drive both red sub-pixels. An example of driving circuitry suitable for use with a four sub-pixel, three data line arrangement is provided in U.S. Pub. No. 2020/0312922, the disclosure of which is incorporated by reference in its entirety.

The two red sub-pixels in embodiments disclosed herein may be formed in any suitable manner. In some cases, the red sub-pixels may include one or more common materials, which may be deposited individually or in a single "blanket" deposition across both red sub-pixel regions. In an embodiment, the red sub-pixels may include emissive regions formed from a single deposition of one or more common emissive materials, such that they share a common emissive layer. Different emission spectra may be obtained via color filters, conversion layers, cavity structures, or the like. For example, two red sub-pixels may be patterned via OVJP or shadow-masked vapor thermal evaporation (VTE), or made from the same emitter using different cavity structures or cavity strengths (or one with a cavity and the other without) to provide two different red colors. As another example, in addition or alternatively, a color filter could be used to make a deeper more saturated red from a less saturated red emitter or from color filters applied to a white emitting pixel. Alternatively, each red sub-pixel may be formed separately, including two different OLED depositions, which may use some or all of the same or different emissive materials. As specific examples, the two R1 and R2 sub-pixels may include emissive regions that have different emitters with the same or different hosts, or the same emissive materials but at different doping concentrations, such as for emissive materials in which a higher doping concentration will result in more saturated emission.

In some embodiments, either or both of the red sub-pixels may use a blue, light blue, or green emissive material in combination with a color filter, conversion layer such as a quantum dot down-conversion layer, cavity structures, or the like to achieve a desired red emission spectrum. As another example, the emissive stack in one or both red sub-pixels may be blue, light blue or green/blue and quantum dot down conversion components may be used to achieve the desired red emission spectra. For example, two differently-patterned quantum dot layers may be used, one for the more-saturated red sub-pixel and one for the less-saturated sub-pixel. As another example, two quantum dot structures may be mixed to provide both R1 and R2 colors, and then different cavities structures may be used to select R1 or R2 in different sub-pixels.

The various arrangements and sub-pixels disclosed herein may use any suitable device structure, including OLEDs, microLEDs, quantum dot devices, or combinations thereof. Four sub-pixel arrangements may be particularly beneficial for microLED displays, because red microLEDs typically have lower efficiencies than green and blue microLEDs. OLED devices used in embodiments disclosed herein may emit via fluorescence, phosphorescence, thermally assisted delayed fluorescence (TADF), phosphor-sensitized TADF, phosphor-sensitized fluorescence, or combinations thereof. The red sub-pixels may use a common emissive material or structure or different materials and/or structures, and one or both may use cavity structures. Other structures used with OLEDs, microLEDs, and/or quantum dot devices may be used, including color filters, cavity structures, up- and/or down-conversion layers or components, outcoupling components, and the like.

Simulation Data

Display simulations were performed using two techniques:

(1) Establishing different color simulated red, green and blue emitters assuming gaussian optical emission spectra and varying their external quantum efficiency (EQE), peak wavelength, and FWHM spectra width. The output in Table 4 is provided in 1931 CIE coordinates and cd/A luminous efficacy.

(2) Use different RGB emitters to simulate OLED displays with varying color gamuts—calculate RGB color balance to achieve the D65 white point and then display power consumption based on RGB efficiencies and color balance.

The DCIP3 blue was modeled as 459 nm, 55 nm FWHM peak with a CIE of (0.141, 0.055). The Rec2020 blue was modeled as 467 nm peak, 10 nm FWHM with a CIE of (0.111, 0.047).

Devices were simulated using red, green, and blue sub-pixels with the indicated properties. The simulated devices were 10.4" OLED displays operating at 500 cd/m$^2$ and 50% pixels fully illuminated. The results are shown below in Tables 4A, 4B, and 4C, which should be read as a single table with device types numbered by "Run" across the three sub-tables. The results include the simulated power consumption in mW versus color gamut, including the examples shown in FIG. 3 as indicated by corresponding reference numerals.

TABLE 4A

|  | Run | Blue | R CIE x | R CIE y | R cd/A | G CIE x | G CIE y | G cd/A |
|---|---|---|---|---|---|---|---|---|
| D65 | | | | | | | | |
| sRGB | 1 | P3 | 0.654 | 0.346 | 100.8 | 0.304 | 0.601 | 176.58 |
| DCIP3 | 2 | P3 | 0.682 | 0.318 | 73.1 | 0.253 | 0.706 | 201.47 |
| sRGB red DCIP3 green | 3 | P3 | 0.654 | 0.346 | 100.8 | 0.253 | 0.706 | 201.47 |
| sRGB green and DCIP3 red | 4 | P3 | 0.682 | 0.318 | 73.1 | 0.304 | 0.601 | 176.58 |
| Rec2020 | 5 | 2020 | 0.708 | 0.292 | 50.5 | 0.167 | 0.794 | 205.50 |
| DCIP3 green and Rec2020 red | 6 | 2020 | 0.708 | 0.292 | 50.5 | 0.253 | 0.706 | 201.47 |
| DCIP3 red and Rec2020 green (32) | 7 | 2020 | 0.682 | 0.318 | 73.1 | 0.167 | 0.794 | 205.50 |
| sRGB to DCIP3 | | | | | | | | |
| sRGB red mid green | 8 | P3 | 0.654 | 0.346 | 100.8 | 0.278 | 0.657 | 189.3 |
| sRGB green and mid red | 9 | P3 | 0.668 | 0.332 | 87.8 | 0.304 | 0.601 | 176.58 |
| mid green and mid red | 10 | P3 | 0.668 | 0.332 | 87.8 | 0.278 | 0.657 | 189.3 |
| mid green and DCIP3 red | 11 | P3 | 0.682 | 0.318 | 73.1 | 0.278 | 0.657 | 189.3 |
| mid red and DCIP3 green | 12 | P3 | 0.668 | 0.332 | 87.8 | 0.253 | 0.706 | 201.47 |
| DCIP3 to Rec2020 | | | | | | | | |
| DCIP3 red mid green (31) | 13 | 2020 | 0.682 | 0.318 | 73.1 | 0.209 | 0.755 | 206 |
| DCIP3 green and mid red | 14 | 2020 | 0.696 | 0.304 | 62.6 | 0.253 | 0.706 | 201.47 |
| mid green and mid red | 15 | 2020 | 0.696 | 0.304 | 62.6 | 0.209 | 0.755 | 206 |
| mid green and Rec2020 red | 16 | 2020 | 0.708 | 0.292 | 50.5 | 0.209 | 0.755 | 206 |
| mid red and Rec2020 green (33) | 17 | 2020 | 0.696 | 0.304 | 62.6 | 0.167 | 0.794 | 205.50 |
| DCIP3 to Rec2020 | | | | | | | | |
| DCIP3 red mid green | 18 | P3 | 0.682 | 0.318 | 73.1 | 0.209 | 0.755 | 206 |
| DCIP3 green and mid red | 19 | P3 | 0.696 | 0.304 | 62.6 | 0.253 | 0.706 | 201.47 |
| mid green and mid red | 20 | P3 | 0.696 | 0.304 | 62.6 | 0.209 | 0.755 | 206 |
| mid green and Rec2020 red | 21 | P3 | 0.708 | 0.292 | 50.5 | 0.209 | 0.755 | 206 |
| mid red and Rec2020 green | 22 | P3 | 0.696 | 0.304 | 62.6 | 0.167 | 0.794 | 205.50 |
| Rec2020 with P3 blue | 23 | P3 | 0.708 | 0.292 | 50.5 | 0.167 | 0.794 | 205.50 |
| Rec2020 with P3 PHOLED blue | 23 P | P3 | 0.708 | 0.292 | 50.5 | 0.167 | 0.794 | 205.50 |
| DCIP3 with Rec2020 blue | 24 | 2020 | 0.682 | 0.318 | 73.1 | 0.253 | 0.706 | 201.47 |
| DCIP3 red and Rec2020 green | 25 | P3 | 0.682 | 0.318 | 73.1 | 0.167 | 0.794 | 205.50 |
| DCIP3 green and Rec2020 red | 26 | P3 | 0.708 | 0.292 | 50.5 | 0.253 | 0.706 | 201.47 |
| sRGB red and Rec2020 green | 27 | P3 | 0.654 | 0.346 | 100.8 | 0.167 | 0.794 | 205.50 |

TABLE 4B

| D65 | Run | R/W | G/W | B/W | Power | % Rec2020 |
|---|---|---|---|---|---|---|
| sRGB | 1 | 23.5 | 69.9 | 6.6 | 1706 | 34.4% |
| DCIP3 | 2 | 32.6 | 61.1 | 6.3 | 1840 | 63.9% |
| sRGB red DCIP3 green | 3 | 38.4 | 55.3 | 6.3 | 1706 | 56.1% |
| sRGB green and DCIP3 red | 4 | 19.9 | 73.6 | 6.5 | 1778 | 42.1% |
| Rec2020 | 5 | 44.40 | 51.50 | 4.10 | 2145 | 100.0% |
| DCIP3 green and Rec2020 red | 6 | 28.5 | 66.2 | 5.3 | 1962 | 74.2% |
| DCIP3 red and Rec2020 green (32) | 7 | 51.6 | 44.4 | 4.0 | 1843 | 93.3% |
| sRGB to DCIP3 | | | | | | |
| sRGB red mid green | 8 | 31.4 | 62.1 | 6.5 | 1707 | 45.8% |
| sRGB green and mid red | 9 | 21.6 | 71.8 | 6.6 | 1738 | 38.2% |
| mid green and mid red | 10 | 28.9 | 64.6 | 6.5 | 1750 | 49.6% |
| mid green and DCIP3 red | 11 | 26.6 | 66.9 | 6.5 | 1816 | 53.5% |
| mid red and DCIP3 green | 12 | 35.4 | 58.3 | 6.3 | 1755 | 59.9% |
| DCIP3 to Rec2020 | | | | | | |
| DCIP3 red mid green (31) | 13 | 42.8 | 52.5 | 4.7 | 1816 | 81.0% |
| DCIP3 green and mid red | 14 | 30.6 | 64.1 | 5.3 | 1846 | 70.7% |
| mid green and mid red | 15 | 39.4 | 55.9 | 4.7 | 1903 | 84.7% |
| mid green and Rec2020 red | 16 | 36.8 | 58.5 | 4.7 | 2066 | 88.0% |
| mid red and Rec2020 green (33) | 17 | 47.6 | 48.36 | 4.06 | 1957 | 96.8% |
| DCIP3 to Rec2020 | | | | | | |
| DCIP3 red mid green | 18 | 42.2 | 52.2 | 5.6 | 1863 | 77.5% |
| DCIP3 green and mid red | 19 | 30.1 | 63.6 | 6.3 | 1901 | 67.6% |
| mid green and mid red | 20 | 38.95 | 55.43 | 5.62 | 1953 | 81.1% |
| mid green and Rec2020 red | 21 | 36.31 | 58.05 | 5.64 | 2115 | 84.3% |
| mid red and Rec2020 green | 22 | 47.2 | 48 | 4.85 | 1994 | 92.8% |
| Rec2020 with P3 blue | 23 | 43.99 | 51.13 | 4.88 | 2199 | 95.9% |
| Rec2020 with P3 PHOLED blue | 23 P | 43.99 | 51.13 | 4.88 | 1876 | 95.9% |
| DCIP3 with Rec2020 blue | 24 | 33.21 | 61.51 | 5.27 | 1776 | 66.8% |
| DCIP3 red and Rec2020 green | 25 | 51.1 | 44.08 | 4.82 | 1892 | 89.4% |
| DCIP3 green and Rec2020 red | 26 | 28 | 65.68 | 6.32 | 2024 | 71.0% |
| sRGB red and Rec2020 green | 27 | 59.91 | 35.35 | 4.73 | 1668 | 82.4% |

TABLE 4C

| D65 | Run | B CIE x | B CIE y | Saturation Parameter |
|---|---|---|---|---|
| sRGB | 1 | 0.141 | 0.055 | 0.89 |
| DCIP3 | 2 | 0.141 | 0.055 | 1.40 |
| sRGB red DCIP3 green | 3 | 0.141 | 0.055 | 2.79 |
| sRGB green and DCIP3 red | 4 | 0.141 | 0.055 | 0.45 |
| Rec2020 | 5 | 0.131 | 0.047 | 1.21 |
| DCIP3 green and Rec2020 red | 6 | 0.131 | 0.047 | 0.53 |
| DCIP3 red and Rec2020 green (32) | 7 | 0.131 | 0.047 | 3.17 |
| sRGB to DCIP3 | | | | |
| sRGB red mid green | 8 | 0.141 | 0.055 | 1.77 |
| sRGB green and mid red | 9 | 0.141 | 0.055 | 0.65 |
| mid green and mid red | 10 | 0.141 | 0.055 | 1.29 |
| mid green and DCIP3 red | 11 | 0.141 | 0.055 | 0.89 |
| mid red and DCIP3 green | 12 | 0.141 | 0.055 | 2.04 |
| DCIP3 to Rec2020 | | | | |
| DCIP3 red mid green (31) | 13 | 0.131 | 0.047 | 2.25 |
| DCIP3 green and mid red | 14 | 0.131 | 0.047 | 0.88 |
| mid green and mid red | 15 | 0.131 | 0.047 | 1.42 |
| mid green and Rec2020 red | 16 | 0.131 | 0.047 | 0.86 |
| mid red and Rec2020 green (33) | 17 | 0.131 | 0.047 | 2.00 |
| DCIP3 to Rec2020 | | | | |
| DCIP3 red mid green | 18 | 0.141 | 0.055 | 2.25 |
| DCIP3 green and mid red | 19 | 0.141 | 0.055 | 0.88 |
| mid green and mid red | 20 | 0.141 | 0.055 | 1.42 |
| mid green and Rec2020 red | 21 | 0.141 | 0.055 | 0.86 |
| mid red and Rec2020 green | 22 | 0.141 | 0.055 | 2.00 |
| Rec2020 with P3 blue | 23 | 0.141 | 0.055 | 1.21 |
| Rec2020 with P3 PHOLED blue | 23 P | 0.141 | 0.055 | 1.21 |
| DCIP3 with Rec2020 blue | 24 | 0.131 | 0.047 | 1.40 |
| DCIP3 red and Rec2020 green | 25 | 0.141 | 0.055 | 3.17 |
| DCIP3 green and Rec2020 red | 26 | 0.141 | 0.055 | 0.53 |
| sRGB red and Rec2020 green | 27 | 0.141 | 0.055 | 6.31 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a full-color organic display panel comprising a plurality of pixels, at least one of the plurality of pixels comprising:
   a red sub-pixel having 1931 CIE coordinates (Rx, Ry);
   a green sub-pixel having 1931 CIE coordinates (Gx, Gy); and
   a blue sub-pixel;

wherein the product $$(0.75-Rx)(Ry-0.25)(Gy-0.5)(0.4-Gx)(10^4)$$

is at least 1.50; and
wherein the color gamut enabled by the RGB colors emitted by the at least one pixel is at least equal to 100% of the area of the DCI-P3 color gamut based on 1931 CIE coordinates.

2. The device of claim 1, wherein the plurality of pixels comprise organic light emitting diodes (OLEDs), micro light emitting diode (microLED) devices, quantum dot devices, or a combination thereof.

3. The device of claim 1, wherein the product $$(0.75-Rx)(Ry-0.25)(Gy-0.5)(0.4-Gx)(10^4)$$

is at least 1.60.

4. The device of claim 1, wherein the product $$(0.75-Rx)(Ry-0.25)(Gy-0.5)(0.4-Gx)(10^4)$$

is at least 1.80.

5. The device of claim 1, wherein the display panel is capable of operating with a color gamut equivalent to at least 95% of the Rec2020 1931 CIE color gamut with a power consumption of not more than 6.85 mW/cm² at 500 nits luminance.

6. The device of claim 5, wherein the display panel is capable of operating with a color gamut equivalent to at least 95% of the Rec2020 1931 CIE color gamut with a power consumption of not more than 5.78 mW/cm² at 500 nits luminance.

7. The device of claim 1, wherein the display panel is capable of operating with a color gamut equivalent to at least 90% of the Rec2020 1931 CIE color gamut with a power consumption of not more than 6 mW/cm² at 500 nits luminance.

8. The device of claim 1, wherein the display panel is capable of operating with a color gamut equivalent to at least 80% of the Rec2020 1931 CIE color gamut with a power consumption of not more than 5 mW/cm² at 500 nits luminance.

9. A consumer electronic device comprising:
a full-color organic display panel comprising a plurality of pixels, at least one of the plurality of pixels comprising:
a red sub-pixel having 1931 CIE coordinates (Rx, Ry);
a green sub-pixel having 1931 CIE coordinates (Gx, Gy); and
a blue sub-pixel;
wherein the product $$(0.75-Rx)(Ry-0.25)(Gy-0.5)(0.4-Gx)(10^4)$$

is at least 1.5 at least 1.50; and
wherein the color gamut enabled by the RGB colors emitted by the at least one pixel is at least equal to 100% of the area of the DCI-P3 color gamut based on 1931 CIE coordinates.

10. The consumer electronic device of claim 9, wherein the device is at least one type selected from the group consisting of: a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

11. The device of claim 10, wherein the plurality of pixels comprise organic light emitting diodes (OLEDs), micro light emitting diode (microLED) devices, or a combination thereof.

12. The device of claim 1, wherein the product $$(0.75-Rx)(Ry-0.25)(Gy-0.5)(0.4-Gx)(10^4)$$

is at least 2.00.

13. The device of claim 10, wherein the plurality of pixels comprise quantum dot devices.

14. A device comprising:
a full-color organic display panel comprising a plurality of pixels, at least one of the plurality of pixels comprising:
a red sub-pixel;
a green sub-pixel; and
a blue sub-pixel;
wherein the color gamut enabled by the RGB colors emitted by the at least one pixel is at least equal to 100% of the area of the DCI-P3 color gamut based on 1931 CIE coordinates and wherein the display panel is capable of operating with a color gamut equivalent to at least 80% of the Rec2020 1931 CIE color gamut with a power consumption of not more than 5 mW/cm² at 500 nits luminance.

15. The device of claim 14 wherein the display panel is capable of operating with a color gamut equivalent to at least 90% of the Rec2020 1931 CIE color gamut with a power consumption of not more than 6 mW/cm² at 500 nits luminance.

16. The device of claim 15, wherein the display panel is capable of operating with a color gamut equivalent to at least 95% of the Rec2020 1931 CIE color gamut with a power consumption of not more than 5.78 mW/cm² at 500 nits luminance.

17. The device of claim 15, wherein the display panel is capable of operating with a color gamut equivalent to at least 95% of the Rec2020 1931 CIE color gamut with a power consumption of not more than 6.85 mW/cm² at 500 nits luminance.

18. The device of claim 14, wherein the plurality of pixels comprise organic light emitting diodes (OLEDs).

19. The device of claim 14, wherein the plurality of pixels comprise micro light emitting diode (microLED) devices.

20. The device of claim 14, wherein the plurality of pixels comprise quantum dot devices.

* * * * *